US010116201B2

(12) United States Patent
Bleus et al.

(10) Patent No.: US 10,116,201 B2
(45) Date of Patent: Oct. 30, 2018

(54) HIGH POWER DENSITY INVERTER (I)

(71) Applicant: Constructions Electroniques + Telecommunications, Wandre (BE)

(72) Inventors: Paul Bleus, Liege (BE); Thierry Joannes, Flemalle (BE); François Milstein, Liege (BE); Pierre Stassain, Malmedy (BE); Fabrice Frebel, Wandre (BE)

(73) Assignee: Constructions Electroniques + Télécommunications, Wandre (BE)

( * ) Notice: Subject to any disclaimer, the term of this patent is extended or adjusted under 35 U.S.C. 154(b) by 0 days.

(21) Appl. No.: 15/742,720

(22) PCT Filed: Jul. 7, 2016

(86) PCT No.: PCT/EP2016/066159
§ 371 (c)(1),
(2) Date: Jan. 8, 2018

(87) PCT Pub. No.: WO2017/005863
PCT Pub. Date: Jan. 12, 2017

(65) Prior Publication Data
US 2018/0205309 A1    Jul. 19, 2018

(30) Foreign Application Priority Data

Jul. 9, 2015    (EP) ..................................... 15176078
Nov. 20, 2015  (EP) ..................................... 15195520

(51) Int. Cl.
*H02M 1/14*     (2006.01)
*H02M 7/5387*   (2007.01)
(Continued)

(52) U.S. Cl.
CPC ............. *H02M 1/143* (2013.01); *H02M 1/08* (2013.01); *H02M 1/12* (2013.01); *H02M 1/126* (2013.01);
(Continued)

(58) Field of Classification Search
CPC ........ H02M 1/14; H02M 1/126; H02M 1/083; H02M 1/1143; H02M 3/285; H02M 3/11;
(Continued)

(56) References Cited

U.S. PATENT DOCUMENTS 3,996,537 A * 12/1976 Neuman ................ H03H 7/427
                                                333/177
5,777,866 A *  7/1998 Jacobs ................. H02M 1/4225
                                                323/222

(Continued)

FOREIGN PATENT DOCUMENTS

JP          5300775 B2    9/2013
WO     WO 2015/125107 A1  8/2015

OTHER PUBLICATIONS

Kolar J W et al.: "PWM Converter Power Density Barriers", Fourth Power Conversion Conference, Apr. 2-5, 2007, Nagoya, Japan, IEEE, Piscataway, NJ USA, Apr. 1, 2007.

(Continued)

*Primary Examiner* — Adolf Berhane
(74) *Attorney, Agent, or Firm* — Reinhard Boerner Van Dueren P.C.

(57) ABSTRACT

The present invention relates to a single phase, non-insulated, miniaturized DC/AC power inverter (1) having an output power density higher than 3000 W/dm$^3$, wherein said first (S1_H), second (S1_L), third (S2_H) and fourth (S2_L) switches are made of wide-band semiconductors and preferably of gallium nitride or GaN semiconductors; and (Continued)

wherein said DC/AC power inverter (1) further comprises: a ripple-compensating active filter comprising a third half-bridge (203) having a fifth switch (S3_H) in series with a sixth switch (S3_L), said fifth switch (S3_H) being connected at one end to the positive terminal (L+) of the DC input, said sixth switch (S3_L) being connected at one end to the negative terminal (L−) of the DC input, the other end of the fifth switch (S3_H) being connected to the other end of the sixth switch (S3_L), defining a third common end, said third common end being connected to a first end of a LC filter, made of at least one inductor (L6) and one storage capacitor (C5), a second end of the LC filter being connected to the negative terminal (L−); modulation control means of said first (S1_H), second (S1_L), third (S2_H), fourth (S2_L), fifth (S3_H) and sixth (S3_L) switches for providing a switch frequency comprised between 20 and 500 kHz and allowing variable phase shifts between any two of said first (201), second (202) and third (203) half-bridges and allowing dead time modulation of the switches of said half-bridges (201, 202, 203), so that to obtain a switching approaching ZVS switching, in particular to obtain switching when current crosses through zero and further to cancel switching losses and so that to allow high peak-to-peak voltage variations in the active filter, while storing corresponding energy in the storage capacitors (C5), wherein the Y-capacitors of the common mode noise filter (100), are referenced to a shielding being at a reference potential, said shielding being insulated from earth, said Y-capacitors having a value comprised between 100 nF and several µF.

14 Claims, 7 Drawing Sheets

(51) Int. Cl.
| | | |
|---|---|---|
| *H02M 1/08* | (2006.01) | |
| *H02M 1/12* | (2006.01) | |
| *H02M 1/15* | (2006.01) | |
| *H02M 7/797* | (2006.01) | |
| *H03K 17/13* | (2006.01) | |
| *H02M 7/523* | (2006.01) | |
| *H05K 3/00* | (2006.01) | |
| *H02M 1/00* | (2006.01) | |
| *H02M 7/48* | (2007.01) | |

(52) U.S. Cl.
CPC .............. *H02M 1/15* (2013.01); *H02M 7/523* (2013.01); *H02M 7/5387* (2013.01); *H02M 7/797* (2013.01); *H03K 17/133* (2013.01); *H05K 3/0061* (2013.01); *H02M 2001/0029* (2013.01); *H02M 2001/0048* (2013.01); *H02M 2001/0058* (2013.01); *H02M 2001/123* (2013.01); *H02M 2007/4811* (2013.01); *Y02B 70/1483* (2013.01); *Y02B 70/1491* (2013.01)

(58) Field of Classification Search
CPC .... H02M 3/3155; H02M 3/325; H02M 3/335; H02M 7/5387; H02M 7/53871; H02M 7/48
USPC ................ 363/47, 48, 65, 71, 123, 131, 132
See application file for complete search history.

(56) References Cited

U.S. PATENT DOCUMENTS

| | | | | |
|---|---|---|---|---|
| 5,969,583 | A * | 10/1999 | Hutchison | .............. H03H 7/427 |
| | | | | 333/12 |
| 8,482,947 | B2 * | 7/2013 | Chapman | .................. H02J 3/38 |
| | | | | 363/71 |
| 2006/0158814 | A1 * | 7/2006 | Wasaki | .................... H03H 7/09 |
| | | | | 361/118 |
| 2007/0057578 | A1 * | 3/2007 | Wasaki | .................... H04B 3/28 |
| | | | | 307/89 |
| 2007/0241838 | A1 * | 10/2007 | Suzuki | .................... H02H 9/005 |
| | | | | 333/181 |
| 2011/0026281 | A1 | 2/2011 | Chapman et al. | |
| 2012/0043950 | A1 | 2/2012 | Truong et al. | |
| 2012/0257429 | A1 * | 10/2012 | Dong | .................. H02M 3/1582 |
| | | | | 363/127 |
| 2016/0036335 | A1 * | 2/2016 | Kojima | .................... H02M 1/44 |
| | | | | 363/21.12 |
| 2017/0110987 | A1 * | 4/2017 | Ghosh | ..................... H02M 1/08 |

OTHER PUBLICATIONS

Gonzalez R et al.: "Transformerless Single-Phase Multilevel-Based Photovoltaic Inverter", IEEE Transactions on Industrial Electronics, IEEE Service Center, Piscataway, NJ, USA, vol. 55, No. 7, Jul. 1, 2008.

Liserre et al.: "An Anti-Islanding Method for Single-Phase Inverters Based on a Grid Voltage Sensorless Control", IEEE Transactions on Industrial Electronics, IEEE Service Center, Piscataway, NJ, USA, vol. 53, No. 5, Oct. 1, 2006.

Yasser Abdel-Rady Ibrahim Mohamed et al.: "Adaptive Discrete-Time Grid-Voltage Sensorless Interfacing Scheme for Grid-Connected DG-Inverters Based on Neural-Network Identification and Deadbeat Current Regulation", IEEE Transactions on Power Electronics, Institute of Electrical and Electronics Engineers, USA, vol. 23, No. 1, Jan. 1, 2008.

Thomas Friedli et al.: "Comparative Evaluation of Three-Phase AC-AC Matrix Converter and Voltage DC-Link Back-to-Back Converter Systems", IEEE Transactions on Industrial Electronics, vol. 59, No. 12, Dec. 1, 2012.

Nayak Parthasarathy et al.: "Study of the effects of parasitic inductances and device capacitances on 1200 V, 35 A SiC MOSFET based voltage source inverter design", 2014 IEEE International Conference on Power Electronics, Drives and Energy Systems (PEDES), IEEE, Dec. 16, 2014, pp. 1-6.

Kumar P et al.: "Soft Computing Techniques for the Control of an Active Power Filter", IEEE Transactions on Power Delivery, IEEE Service Center, New York, NY, US, vol. 24, No. 1, Jan. 1, 2009.

\* cited by examiner

HIGH POWER DENSITY INVERTER (I)

FIELD OF THE INVENTION

The present invention relates to a single phase, non-insulated, miniaturized DC/AC power inverter having a very high, preferably extremely high output power density.

TECHNOLOGICAL BACKGROUND AND PRIOR ART

Power inverters (or in short inverters) are electronic devices which transform direct current (DC) to alternating current (AC). In particular, inverters play nowadays an economic and environmental role which is more and more important in the frame of transformation of DC current produced by solar panels, batteries or similar sources into AC current for domestic or industrial use as well as in electric cars.

Inverters manufactured by the Applicant for commercial and industrial companies permit saving of their critical applications by using energy stored in batteries, during distribution grid breakdown. Inverter Media™ manufactured by the Applicant already allows to reach a power density of 680 W/liter at 2 kVA.

Inverters used for example in electricity production facilities from solar energy still have a noticeable size (typically 50 liters or the size of a portable cooler). Size reduction of >10× in volume, i.e. typically shrinking down to something smaller than a small laptop would enable powering more homes with solar energy, as well as improving distribution efficiency and distances ranges reached with electrical grids. Future will thus be dedicated to more robust, more reliable and more intelligent power inverters.

In order to achieve very high power density and consequently smaller conversion systems, designers of inverter topologies had primarily to target increased efficiency and common mode (CM) noise reduction. Higher efficiency has been achieved thanks to improvements in semiconductor materials and processing, as well as in magnetic materials. Use of wideband-gap semiconductors (silicon carbide—SiC or gallium nitride—GaN) allows to improve efficiency in high frequency power converters, while the latter allow increasing switching frequency and thus reducing passive components size.

It is known that EMI noise is both in the form of conducted EMI, i.e. noise travelling along wires or conducting paths and through electronic components and in the form of radiated EMI (RFI), i.e. noise travelling through the air in the form of electro-magnetic fields or radio waves. In high-speed switching converters (frequency typically from 50 kHz to 1 MHz), most of the conducted EMI comes from the switching transistors and from the rectifiers. For preventing such EMI noise, one generally uses EMI filters made of passive components such as capacitors and inductors forming LC circuits. Conducted EMI is divided into common-mode noise (CMN) and differential-mode noise (DMN). CMN flows in the same direction in line and neutral AC power conductors, is in phase with itself relative to ground and returns to ground. Suitable CMN filter comprises inductors L100, L200 placed in series with each power line and respective Y-capacitors C100, C200 connecting each power conductors to ground (see for example CMN filter 100 in FIG. 1 in the case of a DC/AC converter). DMN exists between AC line and neutral conductors and is 180° out of phase with itself. Suitable DMN filter comprises C340 X-capacitors bridging the power lines, possibly supplemented by differential-suppression inductors L300, L400 (see for example DMN filter 101 in FIG. 1 in the case of a DC/AC converter).

Document US 2011/0026281 A1 discloses an apparatus and method for controlling the delivery of power from a DC source to an AC grid including an inverter configured to deliver power from the unipolar input source to the AC grid and an inverter controller. The inverter includes an input converter, an active filter, and an output converter. The inverter controller includes an input converter controller, an active filter controller and an output converter controller. The input converter controller is configured to control a current delivered by the input converter to a galvanically isolated unipolar bus of the inverter. The output converter is configured to control the output converter to deliver power to the AC grid. Additionally, the active filter controller is configured to control the active filter to supply substantially all the power that is delivered by the output controller to the AC grid at a grid frequency.

Document J. W. Kolar et al, "PWM Converter Power Density barriers», Fourth power conversion conference, 2-5 Apr. 2007, Nagoya (Japan), IEEE (2007), pages 9-29, teaches that in high power density power converters the use of wide band-gap semiconductor switches allows for high size and cost reduction of the passive components.

Document R. Gonzales et al, "Transformerless Single-Phase Multilevel-Based Photovoltaic Inverter», IEEE Trabsactions on Industrial Electronics, Vol. 55, No. 7 (2008), pp. 2694-2702, teaches that the elimination of the output transformer from grid-connected photovoltaic (PV) systems not only reduces the cost, size and weight of the conversion stage but also increases the system overall efficiency. They propose a new high-efficiency topology for transformerless systems, which does not generate common mode currents and topologically guarantees that no dc is injected into the grid. The proposed topology has been verified in a 5 kW prototype.

Document M. Liserre et al, "An Anti-Islanding Method for Single-Phase Inverters Based on a Grid Voltage Sensorless Control", IEEE Transactions on Industrial electronics, Vol. 53, No. 5 (2006), pp. 1418-1426, and document Yasser Abdel-Rady Ibrahim Mohamed et al, "Adaptative Discrete-Time Grid-Voltage Sensorless Interfacing Scheme for Grid-Connected DG-Inverters Based on Neural-Network Identification and Deadbeat Current Regulation", IEEE Transactions on Power Electronics, Vol. 23, No. 1 (2008), pp. 308-321 disclose the use of sensorless state observer current controllers in the field of power inverters.

JP 5 300775 B2 discloses common-mode reduction architecture for a converter connected via a long (>1 km) shielded cable to a jet-fan motor, wherein the Y-capacitors of the common-mode reduction LC-filter are referenced to a shielding of shielded cable, being at a reference potential insulated from earth, i.e. there is no connection between the shield and the earth symbols. Referencing a common mode noise filter to a shielding being at reference potential, said shielding being insulated from earth when implementing EMC shielding is also known from WO 2015/125107 A1.

Finally, T. Friedli et al, "Comparative Evaluation of Three-Phase AC-AC Matrix Converter and Voltage DC-Link Back-to-Back Converter Systems", IEEE Transactions on Industrial Electronics, Vol. 59, No. 12 (2012), pp. 4487-4510, Parthasarathy Nayak et al, "Study of the Effects of Parasitic Inductances and Device Capacitances on 1200 V, 35 A SiC MOSFET Based Voltage Source Inverter Design", 2014 IEEE International Conference on Power Electronics, Drives and Energy Systems (PEDES), IEEE 2014, pp. 1-6 and P. Kumar et al, "Soft Computing Techniques for the Control of an Active Power Filter", IEEE Transactions on Power Delivery, Vol. 24, No. 1 (2009), pp. 452-461 are background art documents in the field of the present invention.

AIMS OF THE INVENTION

The present invention aims at providing a power inverter having extremely high output power density.

In particular the invention is targeting to deliver an inverter having an output power density greater than 50 W/in$^3$ (or 3051 W/dm$^3$ or W/liter) on a maximum load of 2 kVA.

Another goal of the present invention is to allow use of wideband-gap semiconductor switches, while assuring soft switching thereof for reducing switch losses, and while keeping inside acceptable limits for EMI noise generated by the very high switching speed of these components and while suitably managing high dV/dt in the switch commands.

SUMMARY OF THE INVENTION

The present invention relates to a single phase, non-insulated, miniaturized DC/AC power inverter having an output power density higher than 3000 W/dm$^3$, comprising:
- a DC input having a positive terminal (L+) and a negative terminal (L−);
- an AC output having a line terminal (L) and a neutral terminal (N);
- at least a H full bridge switch topology made of a first half-bridge having a first switch (S1_H) in series with a second switch (S1_L), and of a second half-bridge having a third switch (S2_H) in series with a fourth switch (S2_L), said first switch (S1_H) being connected at one end to the positive terminal (L+) of the DC input, said second switch (S1_L) being connected at one end to the negative terminal (L−) of the DC input, the other end of the first switch (S1_H) being connected to the other end of the second switch (S1_L), defining a first common end, said first common end being connected to the line terminal (L) of the AC output, said third switch (S2_H) being connected at one end to the positive terminal (L+) of the DC input, said fourth switch (S2_L) being connected at one end to the negative terminal (L−) of the DC input, the other end of the third switch (S2_H) being connected to the other end of the fourth switch (S2_L), defining a second common end, said second common end being connected to the neutral terminal (N) of the AC output,
- at least one differential mode noise EMI filter connected between the first and the second common ends of the half-bridges and the terminals of the AC output;
- at least one common mode noise EMI filter (100) connected in cascade with the at least one differential mode noise EMI filter (101) connected between the first and the second common ends of the half-bridges and the terminals of the AC output, or vice versa;
- said common mode noise filter having two coupled inductors and at least two Y-capacitors, each connected between an end of one of said coupled inductors and a same reference point and said differential mode noise filter having at least one X-capacitor bridging the line and neutral;
- wherein said first (S1_H), second (S1_L), third (S2_H) and fourth (S2_L) switches are made of wide bandgap semiconductors and preferably of gallium nitride or GaN semiconductors;
- and wherein said DC/AC power inverter further comprises:
  a ripple-compensating active filter comprising a third half-bridge having a fifth switch (S3_H) in series with a sixth switch (S3_L), said fifth switch (S3_H) being connected at one end to the positive terminal (L+) of the DC input, said sixth switch (S3_L) being connected at one end to the negative terminal (L−) of the DC input, the other end of the fifth switch (S3_H) being connected to the other end of the sixth switch (S3_L), defining a third common end, said third common end being connected to a first end of a LC filter, made of at least one inductor (L6) and one storage capacitor (C5), a second end of the LC filter being connected to the negative terminal (L−);
  modulation control means of said first (S1_H), second (S1_L), third (S2_H), fourth (S2_L), fifth (S3_H) and sixth (S3_L) switches for providing a switch frequency comprised between 20 and 500 kHz and allowing variable phase shifts between any two of said first, second and third half-bridges and allowing dead time modulation of the switches of said half-bridges;
- so that to obtain a switching approaching ZVS switching, in particular to obtain switching when current crosses through zero and further to cancel switching losses and so that to allow high peak-to-peak voltage variations in the active filter, while storing corresponding energy in the storage capacitors (C5), thereby compensating for a voltage ripple less than 3% on the input DC voltage,
- wherein the Y-capacitors of said common mode noise filter are referenced to a shielding being at a reference potential, said shielding being insulated from earth, said Y-capacitors having a value comprised between 100 nF and several μF and wherein the parasitic or leakage capacitance between the shielding and earth is limited to a few nF, typically 10 nF, being thereby compliant with safety standards;
- characterized in that the DC/AC power inverter (1) comprises, for each switch, a capacitive divider (301) that is branched in parallel on the command line between the switch gate and the switch driver (303), for detecting the switch current zero crossover through the gate connection of the respective switches, and so as to adjust a switch dead-time which is sufficiently long to prevent a risk of cross conduction between the switches of a half-bridge, while minimizing power losses due to reverse currents.

According to preferred embodiments, the DC/AC power inverter of the invention also comprises at least one of the following characteristics, or a suitable combination thereof:
- the coupled inductors of the common mode noise filter have an external volume of about 5000 mm$^3$, in the case of a 2 kW inverter, compatible with a reduced magnetic flux variation in said coupled inductors, obtained thanks to dynamic change of PWM phase between the two legs of the full bridge;
- it comprises an input tank capacitor (C1) less than 15 μF, the active filter capacitor (C5) being less than 150 μF;
- it comprises sensorless state observers for estimating the currents in the inverter, except the output current;
- the circuit further comprises a common mode noise filter relative to the shielding reference potential for protecting each switch driver, the inductors L31, L32 of the common mode filter and the capacitors C33, C34 and the resistor R' of the capacitive divider being part of a RLC filter R'-L31-L32-C33-C34 acting as a low-pass filter whose components are selected so as to reduce the dv/dt on each switch to a value less than 50 V/ns and preferably less than 25 V/ns;

it comprises an open loop Hall sensor combined with an electromagnetic shield for measuring the inverter output current;

the capacitors are multilayer ceramic capacitors;

an auxiliary power supply is provided under the form of a soft switching LLC resonant circuit;

it comprises control means for maintaining DC input voltage essentially constant, while allowing ripple variation across the active filter;

the first half-bridge and the second half-bridge are each split by an additional half-bridge mounted thereon in parallel;

a second common-mode noise filter and a second differential-mode noise filter are located on the DC input side between the DC input terminals (L+, L) and the entry of the H full bridge.

SHORT DESCRIPTION OF THE DRAWINGS

FIG. 1, already mentioned above, shows the principle of designing a basic solution for EMI filtering (common mode and differential filtering) in a DC/AC power converter.

FIG. 2 schematically represents an example of embodiment for an inverter according to the present invention, the inverter having a five legs (or half-bridges) topology.

FIG. 3 schematically represents a preferred embodiment for GaN driver protection against common mode EMI high dV/dt according to the present invention.

Figure 7:
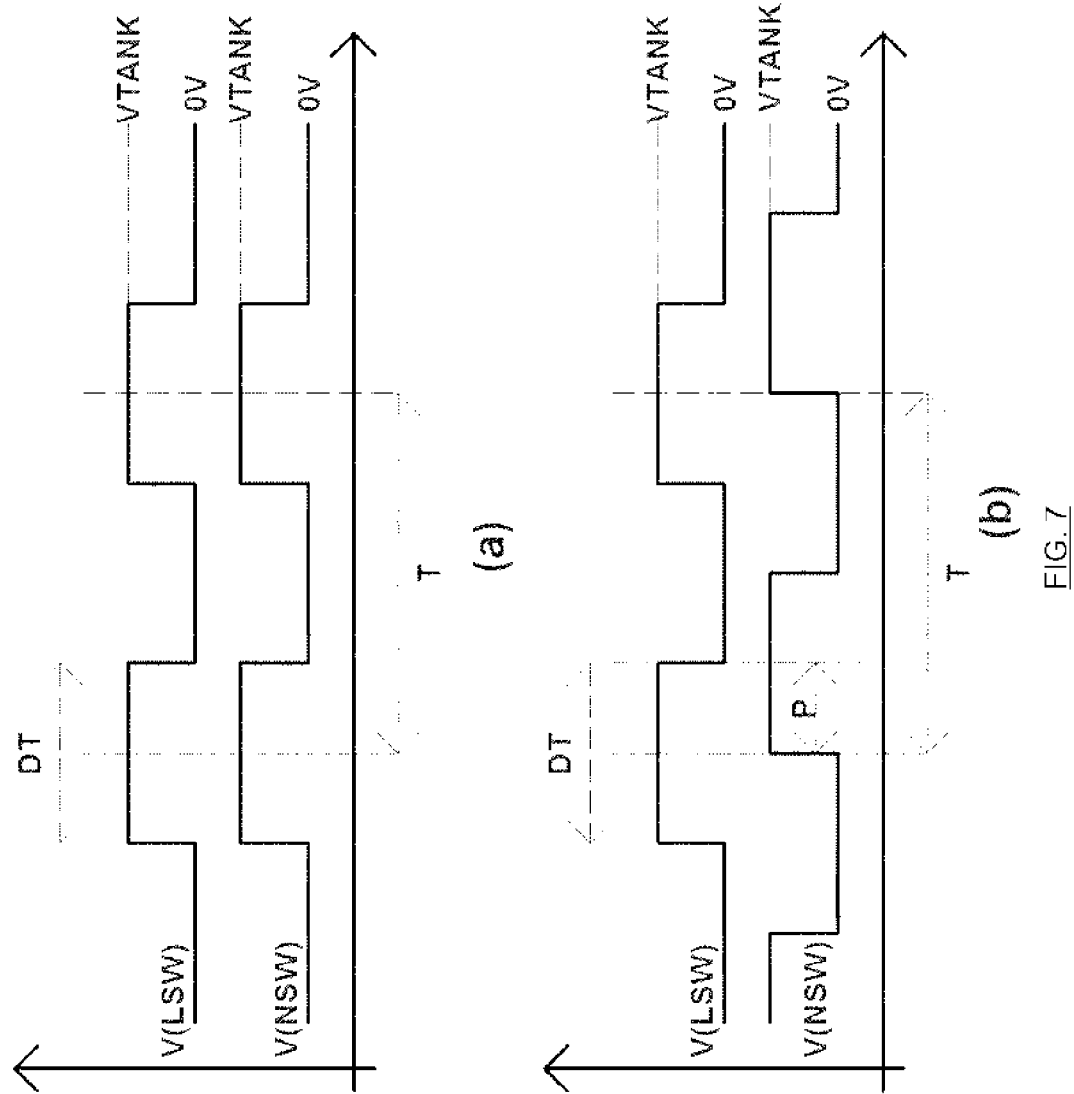

FIGS. 7a) and b) respectively represent a particular case of switch pulse wave modulation.

DETAILED DESCRIPTION OF THE INVENTION

According to one embodiment, the inverter according to the present invention has to be designed to meet the requirements of Table 1.

Accordingly, GaN transistors operated in so-called soft switching mode or ZVS (Zero Voltage Switching) mode, combined with a specific parallel active filtering topology and with the use of multilayer ceramic capacitors (MLCC) as storage components are the key factors that have contributed to reaching such a high power density. The shape of the heatsink, the geometric arrangement of the ceramic capacitors and a thermal interfaces optimization contribute still to a low temperature of the device while in full load operation. An optimized software running on a fast microcontroller associated with a dedicated logic circuit (CPLD for complex programmable logic device) warrants ZVS behavior through the entire operation range and reduces electromagnetic noise. Double shielding and an optimized set of filters allow the inverter to meet electromagnetic compliance requirements.

DETAILED DESCRIPTION OF PREFERRED EMBODIMENTS OF THE INVENTION

The design methodology applied comprises: precise dimensioning with analytical calculations and finite elements modeling; use of SPICE simulations for power and control; 3D mechanical modeling; and use of thermal simulations. This allowed to create an inverter device meeting all the requirements of Table 1 in a single calculation run.

According to a preferred embodiment of the invention, the use of GaN technology enables a power density of ~143 W/in.$^3$ for the 2 kVA inverter designed in this project. The dimensions thereof are approximately 2.5×1.6×3.5 inches, corresponding to a volume of about 14 inches$^3$ (or 0.2 liter).

GaN transistors have many very useful electrical characteristics (low $R_{ds\_on}$, low $Q_{gate}$ and $C_{ds}$, ultra-low $Q_{rr}$). These clearly create technological advantages over currently and routinely used MOSFET and IGBT devices (both having small size and low production costs). Unfortunately, they also have serious drawbacks due to their very fast switching characteristics (for example extremely high "dV/dt"): they are noticeably challenging to drive and also require sensitive electromagnetic noise management. Another pitfall is the high voltage drop due to the reverse current when the GaN is turned off. One solution selected according to the present invention to overcome these difficulties consists in controlling all GaN transistors using soft switching (or ZVS switching) through the entire operation range.

Figure 2:
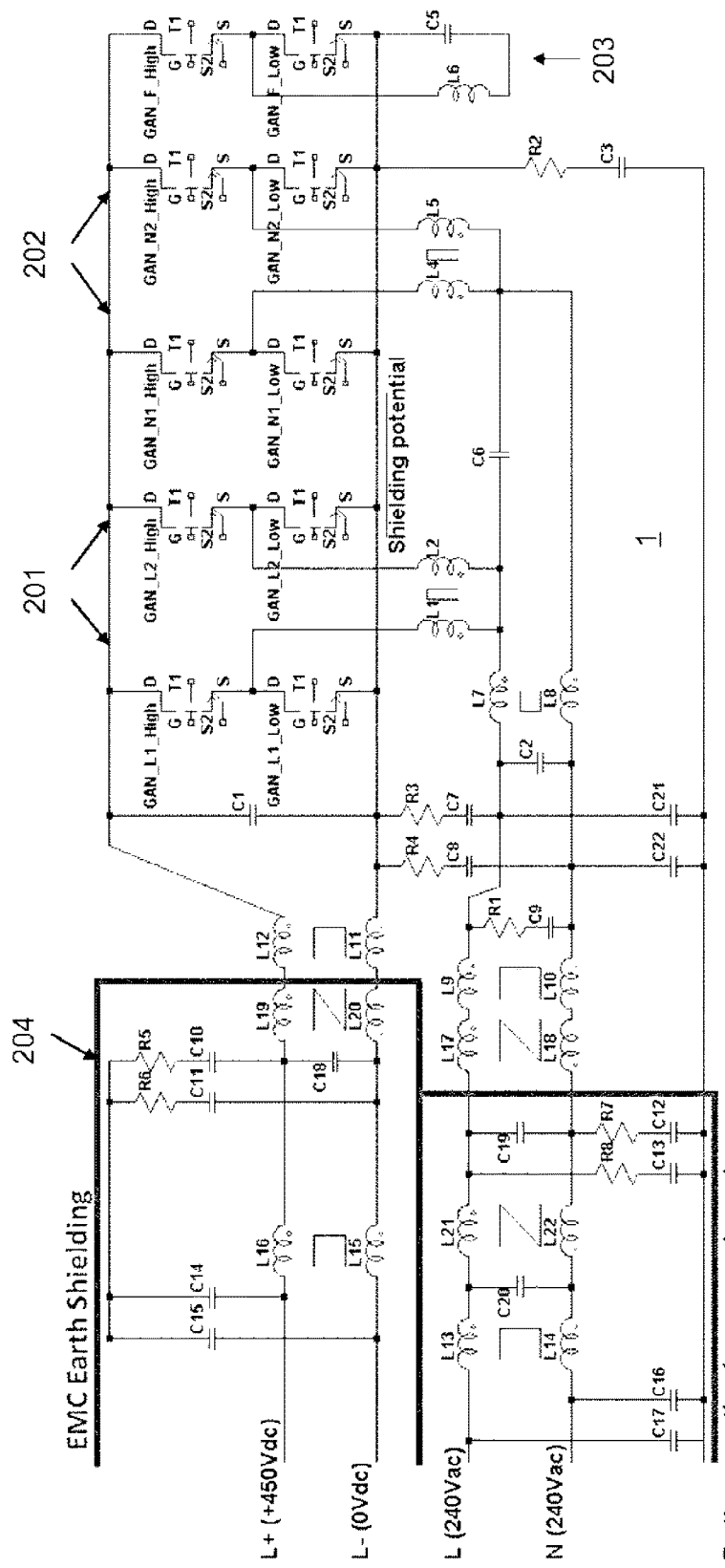

In order to combine a continuous current at the 450 V input stage with an alternating 240 V output voltage, an inverter 1 with at least a three legs topology (full-bridge or 2-legs topology with a supplemental active filter) is chosen. Preferably, a five legs topology is chosen according to a preferred embodiment shown in FIG. 2, because it minimizes energy transfer within the inverter. Accordingly the first half-bridge and the second half-bridge are each preferably split by an additional half-bridge mounted thereon in parallel. It allows accommodating high current and slight switching time differences.

Two half bridges 201 (HB) generate the line voltage, while two further half bridges 202 generate the neutral voltage and the last half bridge 203 is used as the above-mentioned active filter.

According to this preferred embodiment (see further FIG. 2), inductors L1 to L6 are rated between 10 pH and 50 pH. Due to the active filter 203 (with C5/L6), input capacitor C1 is reduced to less than 15 µF and C5 is rated at less than 150 µF. Common mode inductors (L7 to L16, see inversed "C" symbol) are rated between 200 µH and 1 mH. The total rating of corresponding Y capacitors (C7, C8, C10-C17, C21, C22) is more than 500 nF while keeping the leakage current below the allowed value (initially 5 mA) because the output sine wave is symmetric between L+ and L−, i.e. $(V_L+V_N)/2$~=$(V_{L+}+V_{L-})/2$~=$V_{Earth}$ with split phase grounding configuration and cancels the leakage current, and because some Y capacitors (C7, C8) return to the shield. The EMC differential inductors (L17 to L22, see "Z" symbol) are rated between 10 µH and 20 µH and the X capacitors (C2, C6, C9, C18 to C20) range from 1 µF to 5 µF.

The high density and the high efficiency of this inverter both come from optimized control of the five legs, via switching. For any type of load, this control shall achieve soft switching operation of all GaN devices while minimizing reverse currents during the dead times. A control algorithm ensures that the module is naturally protected against overcurrents. During the debug phase, problems were encountered by the inventors, due to the high processing load demanded by the control algorithm. Finally the processor was upgraded, by use of a 40% faster pin-to-pin compatible model.

The objectives of the control are achieved by applying the following principles:
digital control based on a fast microcontroller combined with a dedicated logical circuit (CPLD);
fast measurement of input/output currents and voltages;
efficient feedback on the switching events of the HBs;
a learning algorithm for driving the active filter;
optimization of the switching frequency between 35 and 240 kHz depending on the output current; a variable phase shift between the HBs (0° or 90°) and a dead time modulation of the five HBs (50 ns to 3 μs). The switching losses are then almost canceled and the frequency increase helps to optimize (reduce) the size of the passive components.

Practicing phase shift between the neutral and the line HBs (2 or 4 resp.) is necessary because the DMN filtering inductors are optimized at no phase shift. Soft switching does thus not occur anymore at each GaN switch. Moreover as switching is effected at extremely high speed, and with some uncertainty upon the current flowing in the DMN filtering inductors, next current switch may occur at a current value that has not (yet) returned to zero, thus leading to "not being ZVS". A solution found for letting the current go closer to zero is to increase the dead time of the switch (not shown).

Figure 3:
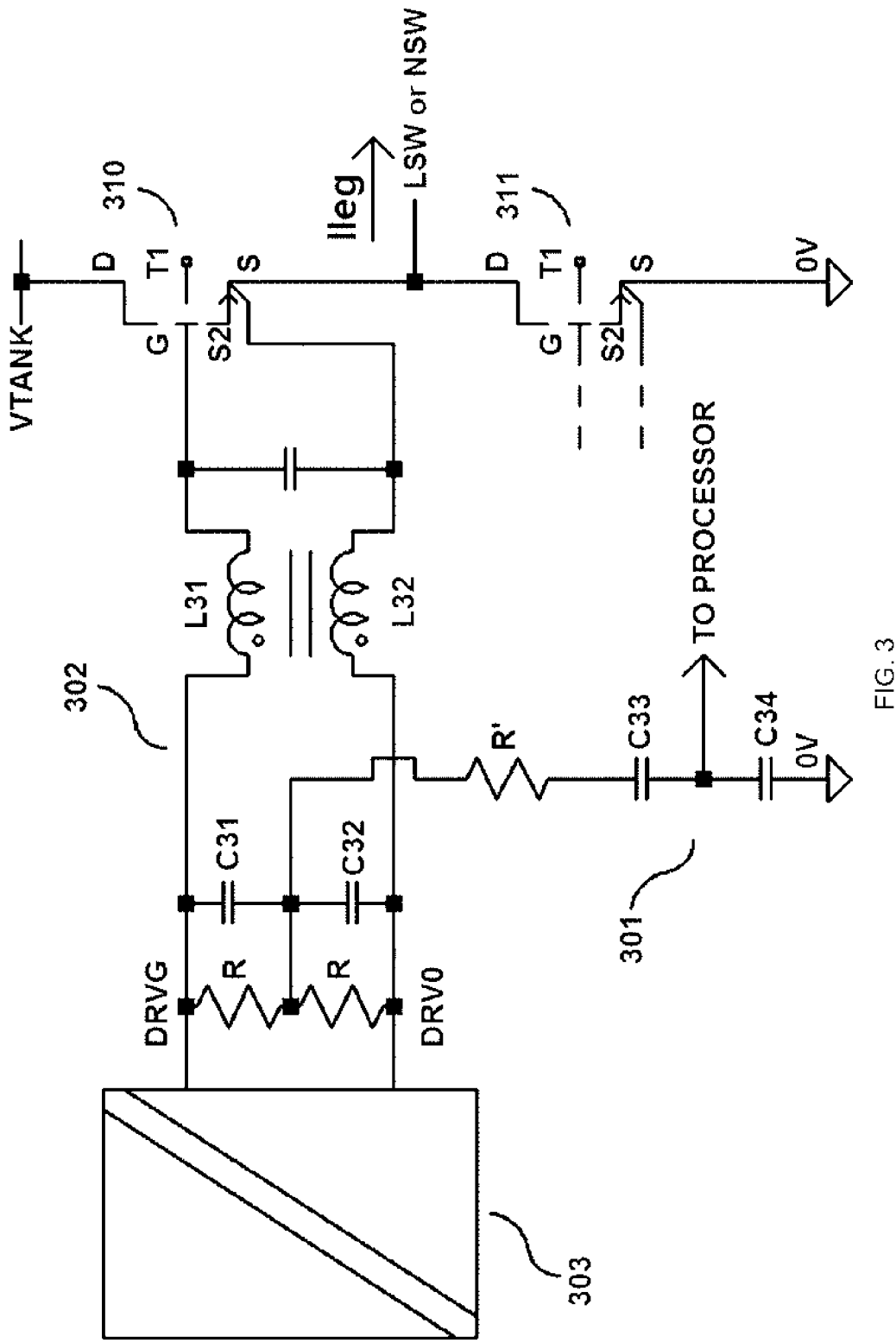

Due to the high speed switching in the converter of the present invention, according to one embodiment, no direct current measurement is carried out but capacitive voltage divider 301 (C33, C34), is used for detecting when the current goes to zero (see FIG. 3). By suitable choice of the capacitors, this capacitive divider allows the processor to manage an acceptable voltage measurement (typically about 5 V instead of maximum peak voltage of 450 V).

In FIG. 3, the half bridge leg is fully represented with GaN transistors 310, 311. The purpose of the capacitor divider is thus to get a signal that indicates when the transistors 310, 311 effectively undergo switching (or 0V crossing over).

When a GaN transistor is conducted in reverse mode, i.e. when current goes from source (S) to drain (D) via the free-wheel diode (not shown), it is well known that the voltage drop is quite high (a few volts), if the GaN control is in OFF state. This leads to high energy loss. For that reason, when switching the current from one transistor to the other, it is crucial to have a dead-time as short as possible. However, a dead time that is too short is dangerous and the risk of cross conduction between transistors 310, 311 has to be avoided with some security margin. Finally a compromise has to be found for a dead time which is nor too low (safety risk) nor too high (energy loss).

The purpose of the capacitive divider circuit according to the present invention is to detect the instant when current stops flowing in one transistor in order to be able to safely switch later on the other transistor. Current detection by usual means in the situation of fast GaN switching is difficult and costly and the solution provided here solves the problem with a very small and simple circuit.

Let us consider the case when transistor 311 switches OFF and current Ileg is negative. There is some time that elapses from sending the OFF signal to 311 until V(LSW) or V(NSW) rises because:
there is delay (temperature dependent) in the driver that controls 311,
there is time required to charge output capacitances of 310 and 311 that depends on the value of Ileg,
in some conditions, Ileg can be in the wrong direction and it takes time for Ileg to change direction to allow soft transition.

After that the aforementioned delays has elapsed, LSW (or NSW) potential finally rises. Circuit 301/302 scales and reports this voltage variation as the "TO PROCESSOR" signal with a very short delay. The processor controlling transistor 311 is then able to quickly and safely switch ON transistor 310 because it knows that 311 is fully OFF (voltage at LSW or NSW has started to rise).

With the proposed solution, the dead time is minimized independently of the involved delays, thus leading to minimum power losses.

In this invention the robustness of the GaN control is critical. Indeed, GaNs switch extremely fast so that they generate high "dV/dt" across the control isolation, far beyond the allowed values for most of the drivers currently on the market. Furthermore, the gate voltage threshold is very low. Still according to the invention, a very compact, low cost and extremely robust driver circuitry has been designed that can drive GaN transistors well within their specifications (see FIG. 3). According to one embodiment shown on FIG. 3, one takes advantage of additional source and gate inductances (L31, L32) to reject CMN traveling in the GaNs directly to ground, without affecting GaN driver 303. CMN filter 302 is provided therefor (L31, C31, L32, C32).

With high-speed devices like GaN transistors, the voltage variation (dv/dt) at nodes LSW or NSW is very high and typically reaches 100 to 200 V/ns. That means that the switching time is in the range of 2 to 4 ns for a 400 V excursion.

Such high-speed variation can disturb driver circuit 303 which is not able to support such voltage variations on its DRV0 and DRVG nodes.

According to an embodiment of the invention, as shown in the circuit of FIG. 3, the high rate voltage change at node LSW or NSW is reported on DRV0 and DRVG through a RLC filter (L31-L32, R' and C33, C34). This filter acts as a low pass filter for this common mode voltage change and reduces the high dv/dt.

Entry capacitors of the driver, C31 and C32 are typically about 100 nF, while C33, C34 are typically about 50 pF and 10 nF respectively, for achieving the function of capacitive divider.

It should be noted that, as the control signal of the transistor 310 is generated by driver 303 on nodes DRV0 and DRVG, it is nearly unaffected by the inductor L31-L32 because this inductor appears inductive in common mode only.

Sizing of L31-L32, R' and C33, C34 may be critical but the circuit allows to reduce the dv/dt seen by driver 303 below typically 25 V/ns, a value well supported by most drivers.

Selecting a right GaN package is also very important. According to an embodiment, a SMD (surface mount) model with a 2-source access, one for the power, one for the command, was selected as the best choice for this design. It allows safe control of the transistor. Moreover, a small package reduces the parasitic inductances and consequently the functional overvoltage. The PCB layout and the positioning of the decoupling capacitors are crucial for operating the GaN properly.

Further Considerations About Common Mode and Differential Mode Noise Filters

Figure 1:
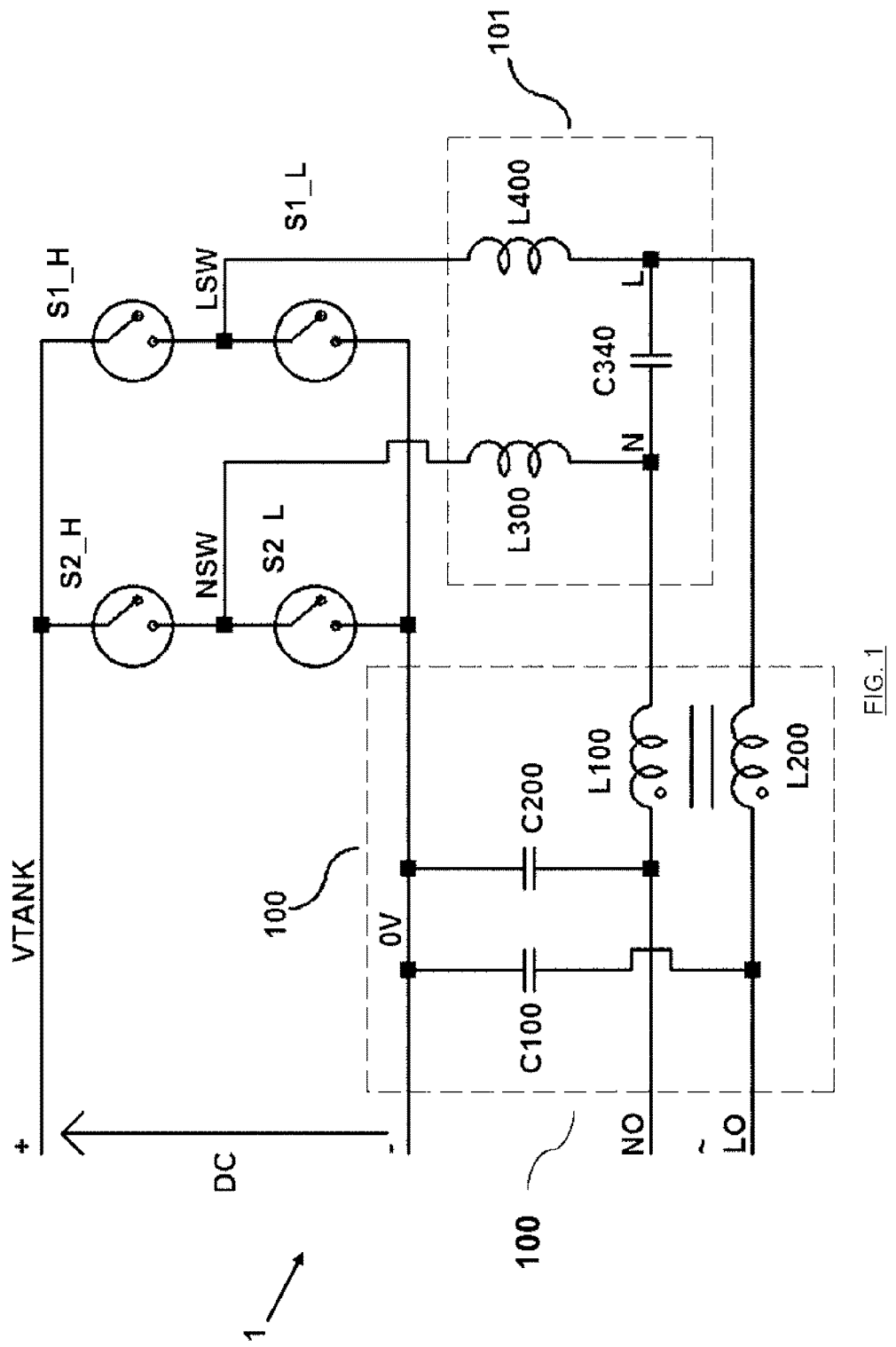

A big challenge in the full-bridge (S1_H, S1_L, S2_H, S2_L) topology of FIG. 1 is to cope with the common-mode noise generated by the switching of quite high voltages (between 0 V and 400 V (VTANK) for example).

Persons skilled in the art know the benefit of using common-mode filters to reduce this kind of noise. Common-mode filters are typically made of a common-mode choke and "Y" capacitors connected to the earth. They short the common-mode noise by creating a current path to the earth. The issue with such a structure is that the capacitors referenced to earth generally should have very limited value due to safety requirements. Large capacitor values would possibly lead to a dangerous current going to the earth connection. Therefore, capacitor values are limited to a few nanofarad (typically 10 nF). Moreover, in some applications, small value of parasitic capacitance further creates a problematic common-mode current.

To design an efficient and compact filter, it is advantageous to increase the size of these capacitors because the energy storage density of capacitors if far higher compared to inductors. Otherwise, with small capacitors, filter inductors have to be large, which is detrimental to miniaturization.

The solution of the present invention allows large values of C100 and C200 (FIG. 1) because C100 and C200 are not connected to earth but they short the common-mode current directly to a reference potential (0V), which in turn is insulated from earth.

However size reduction is allowed only if some conditions are met. In case C100 and C200 are "large" (typically from 10 nF to several μF), voltage across C100 and C200 are nearly constant during a switching period. Therefore, L100-L200 sees a voltage during a part of the switching period, the product of this voltage by dt is called Edt, because it is the magnetic flux variation through the inductor. It is known that L100-L200 size is then nearly proportional to Edt.

During the generation of the 50 Hz inverter output sine-wave, let us consider worst case situation. Referring to FIG. 7a), S1_H to S2_L are controlled in centered pulse width modulation. When the 50 Hz sine-wave voltage reaches 0V, the duty cycle D being 50%, it is easy to evaluate Edt to be sustained by L100/L200 at that instant:

S1_H and S2_H area ON, S1_L and S2_L are OFF, $D = 50\%$, $V(NO) = V(LO) = V(VTANK)/2$, V across L300 and L400 are nearly 0 because L100/

L200 (common mode) >> L300/L400 (differential mode), $Edt = (V(VTANK) - V(NO))*DT =$ $(V(VTANK) - V(VTANK)/2)*50\%T = V(VTANK)*T/4$.

To achieve size reduction with the circuit of FIG. 1, according to an embodiment of the present invention, the modulation phase is dynamically changed in order to reduce Edt and therefore the size of L100/L200 by at least a factor of 2. Referring to FIG. 7b), P is a phase that is dynamically changed when the 50 Hz inverter output sine-wave approaches 0V. P is typically set at 90° as shown on FIG. 7b). One can easily see that S1_H, S2_H are simultaneously ON only during half the time and Edt is reduced by the same ratio allowing operation of the proposed circuit with a smaller L100-L200 inductor:

$Edt = V(VTANK)*T/8$.

It should finally be noted that choosing larger P still yields a lower Edt for L100-L200 but while increasing the ripple current in L300 and L400, which would require increasing the size of L300/L400. That is the reason why a typical phase angle of 90° is preferably considered.

According to the invention, with such a suitable dynamic change of modulation phase, the total volume of each inductor L100, L200 can be reduced from typically 10000 mm³ in the art to about 5000 mm³, for a 2 kW converter.

120 Hz Input Current/Voltage Ripple Requirement

To meet the ripple requirement on DC voltage/current input a parallel active filter was designed that can compensate ripple more efficiently than using a large capacitor at the input side. The adopted solution is also more reliable than the use of a "boost"-based topology for which the working voltages could rise up to the limit $V_{max}$ of the GaN transistors.

The active filter works with higher voltage variations (~200 $V_{pk-pk}$) and stores the corresponding energy in ceramic capacitors whose capacitance rises as the voltage decreases, leading to three benefits:

size reduction of the input tank capacitor C1 (less than 15 μF), size reduction of the filter capacitor C5 to less than 150 μF, inverter robustness due to the use of the GaNs below 450 $V_{dc}$.

The software also contributes thereto; the algorithm maintains $V_{in}$ constant while allowing a larger ripple across the active filter. Moreover, a learning algorithm still reduces the input ripple (by a factor of 3) through correction of the modeling errors due to the presence of dead times.

Miniaturization of Components for DC-AC Conversion

According to an embodiment, use of MLCC capacitors (i.e. ceramic capacitors) for energy storage leads to a more compact and efficient module.

Moreover magnetic components are mainly composed of ferrite whose magnetic losses are known to be very low at high frequencies. The use of Litz wires minimizes the losses due to skin and proximity effects. For further miniaturization, the wires are wound directly onto the ferrite, without a coil former. Their cooling is provided by the air flow of the fan and by use of an aluminum oxide foil placed in the middle of the ferrite to create the requested air gap plus a thermal drain. The size of the filter capacitors and inductors is optimized by increasing allowed ripple current.

As to the output current, an open loop Hall sensor combined with an electromagnetic shield leads to a very compact measurement device, offering galvanic decoupling and reducing the sensitivity to common mode and parasitic inductance noise. Time response thereof is very short which contributes to protect the inverter from short-circuit or high load impacts.

It is wise to note that all other current estimations ($I_{inductor}$, etc.) are made by state observers without current sensors (sensorless measures, e. g. voltages), thereby reducing the overall inverter size.

Thanks to a specific GaN control modulation which reduces the current within the filter inductors L7-L8 (see FIG. 2), their core size is reduced without reaching saturation level.

Obtaining a sandwich structure for all the PCB boards and the heatsink represents a real challenge. As shown on FIG. 5, it was obtained by using micro-spring contacts 507, custom heatsink 512 made by EDM (Electrical Discharge Machining), ultra-thin PCB boards 510, 513, etc. (0.012 inch thick), silicone foam 508 to spread GaN contact pressure on the heatsink 512. All these technical features greatly helped to reduce the size of the inverter.

According to one embodiment, the inverter module comprises mainly two parts. The first one includes device control, auxiliary supply, the five legs (or half bridges) and their corresponding drivers together with the heatsink. The second part includes the passive filters.

Preferably, a soft switching LLC resonant topology is used for the isolated auxiliary supply 12V/5V/3.3V (~10 W). This reduces the volume thereof to less than 0.128 in.$^3$ (0.8×0.8×0.2 in.), which enables suitable integration within the above-mentioned control part on an unique PCB.

Thermal Management

Based on the estimated and simulated losses, forced-air cooling is the only viable solution able to sufficiently reduce the thermal resistance to ambient air. According to an embodiment, an efficient axial fan (~1.57×1.57×0.6 in.) is placed in the middle of the front plate.

Figure 4:
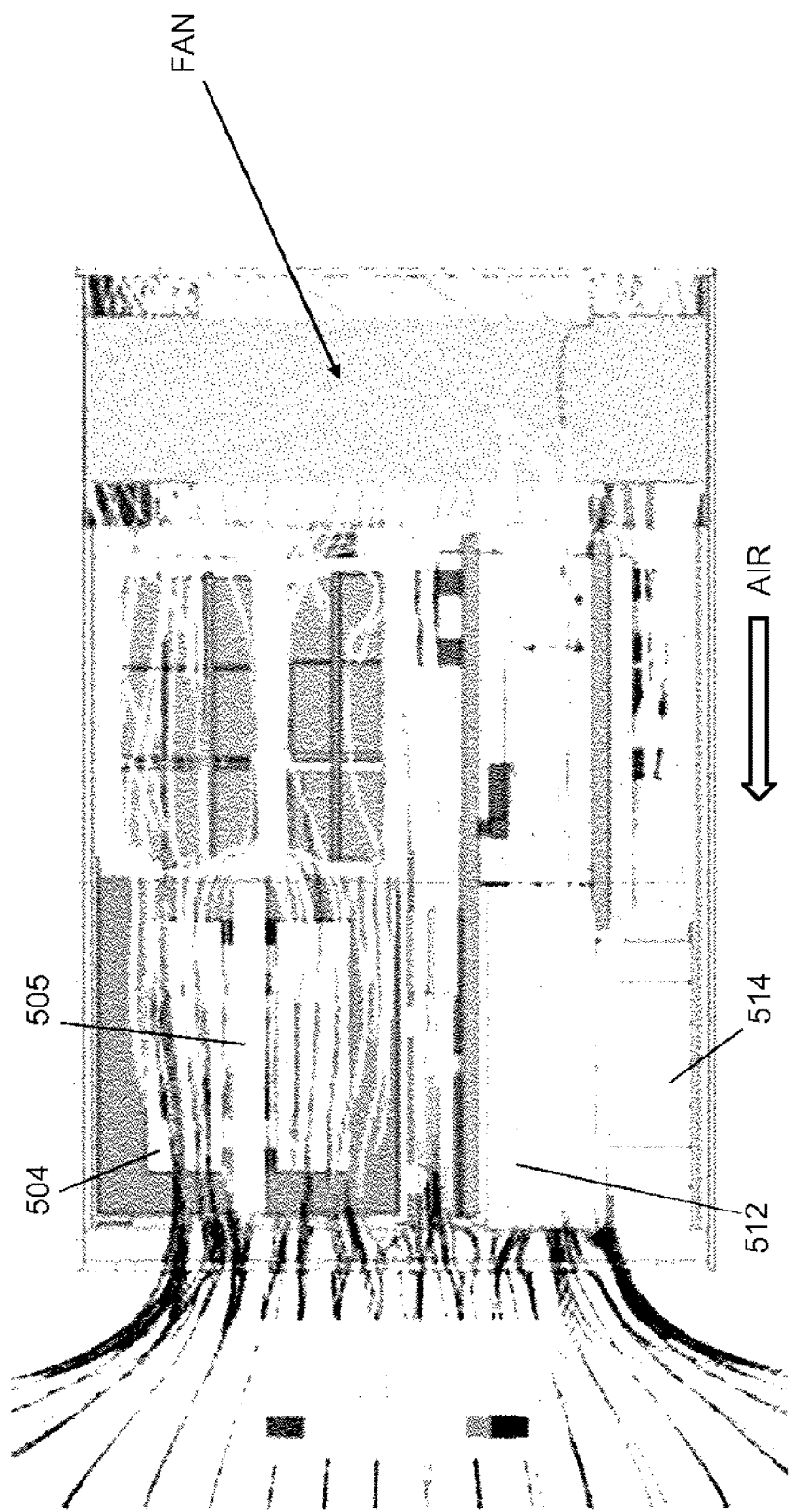
FIG. 4 represents a thermal mapping for an example of inverter components implementation in the present invention, according to a plan view thereof, wherein the hottest parts are located in the direct air flow.

The thermal simulation mapping in FIG. 4 shows the result when all components are optimally positioned around the fan, namely:
- hottest components placed in the direct air flow;
- exchange surface areas maximized;
- pressure losses minimized;
- air speed near the side optimized and
- fresh air entry near the GaN heatsink to minimize the thermal resistance, maximizing the inverter efficiency.

Figure 5:
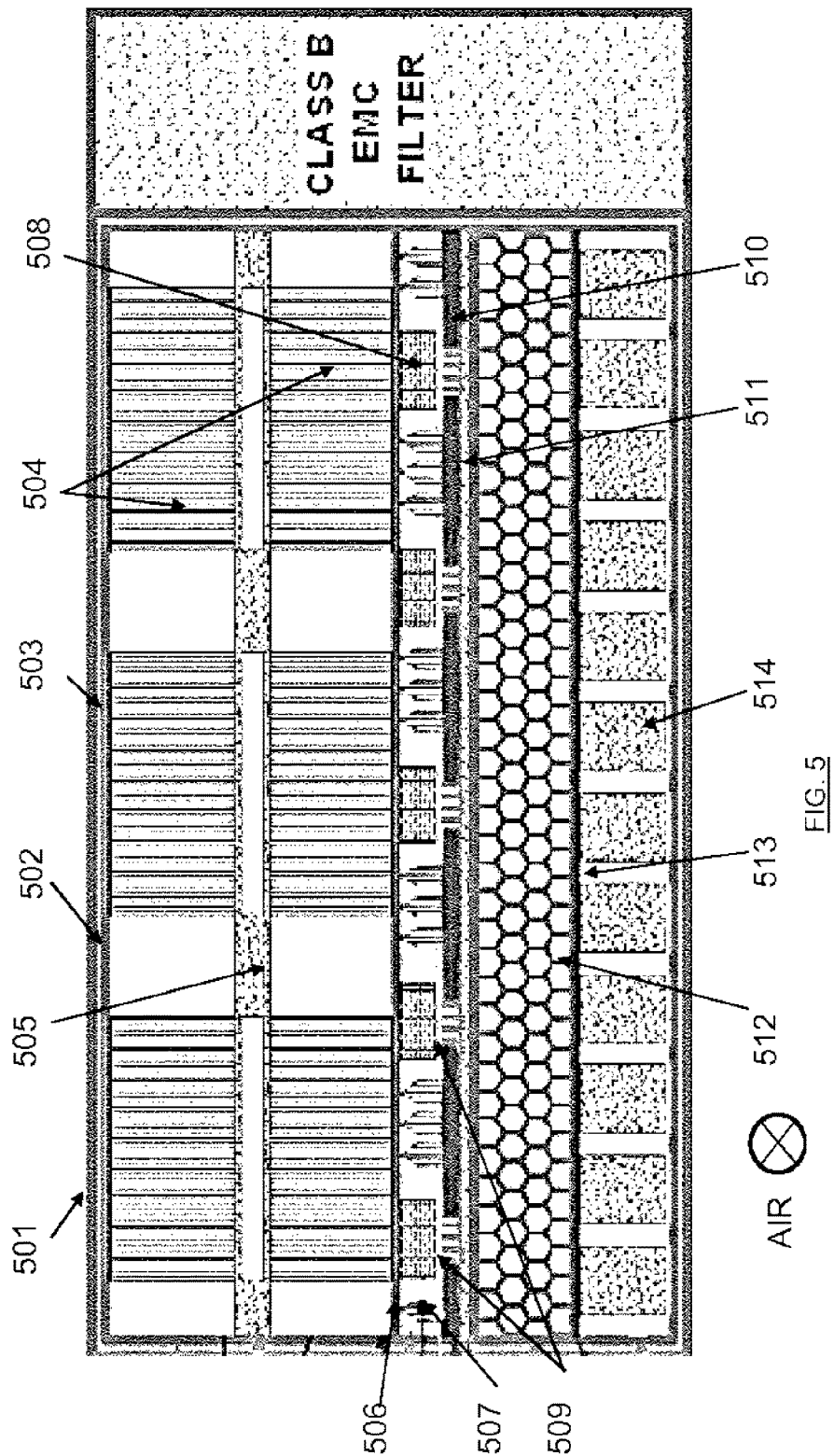
FIG. 5 represents, in a height cross-section view, a detailed structure of the thermal interfaces in an inverter according to an embodiment of the present invention.

Choosing suitable thermal interfaces is then very critical in reducing hot spots on the outer inverter surface. FIG. 5 shows the thermal stack or sandwich according to one embodiment (height cross-section view). The GaN junction temperature does not exceed 60° C. with an ambient temperature of 30° C. at 2 kW load.

FIG. 5 shows a detailed structure of the thermal interfaces according to one embodiment. For one GaN transistor 509 (~2 W loss), the thermal impedances are as follows:
- GaN junction—thermal pad: 0.5° C./W;
- PCB design 510 maximizing heat transfer from the GaN transistor 509 to the heatsink 512: 1.1° C./W;
- thermal compound with aluminum oxide dust: 0.3° C./W;
- ceramic insulation foil with aluminum nitride 511: 0.02° C./W;
- thermally conductive glue with silver dust: 0.15° C./W and
- honeycomb-shaped heatsink 512 with forced air (see below): 13° C./W (relative to a single GaN).

The external shield 501, 503 and the heatsink 512 are both made of copper, while the storage capacitors 514 are ceramic MLCC. Both materials were chosen to enhance heat flux and exchange surface area. The capacitor assembly constituting the active filter is an energy storage device but is also an extension of the heatsink 512. The air flow between each MLCC row (preferably with a gap of ±0.04 in. or 1 mm between capacitors) enhances the cooling effect, as the capacitors sides play the role of fins. The volume occupied by the energy storage unit acts as a second heatsink, due to the assembly geometry and the capacitor type (good thermal conductor).

Figure 6:
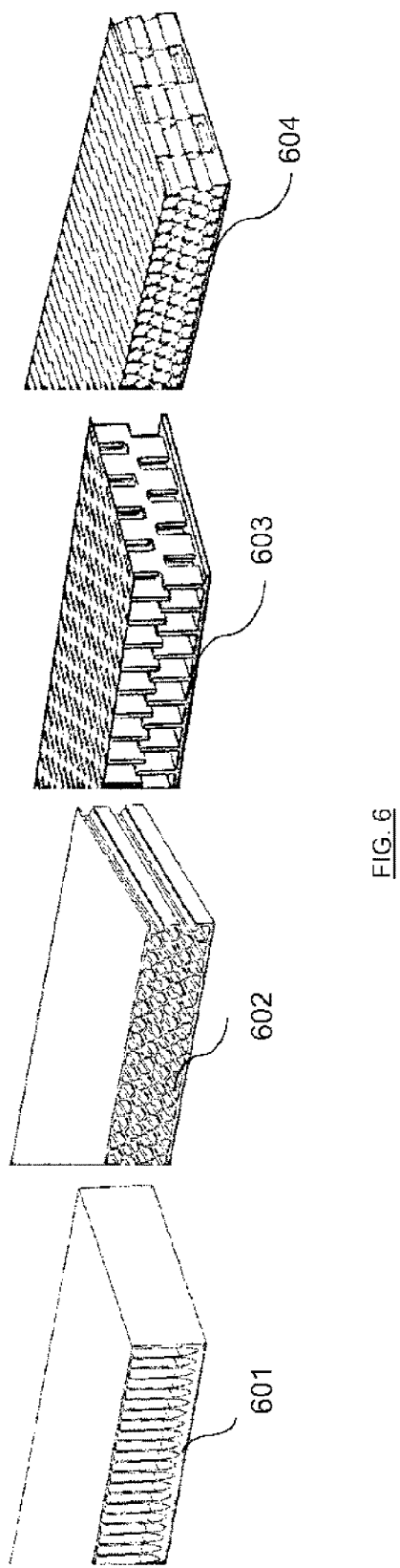
FIG. 6 represents several examples of simulated heatsinks suitable to be used in the present invention.

Several types of heatsinks as shown in FIG. 6 have been thermally simulated and compared with the above-mentioned 3D model (multiple blades 601, honeycomb 602, fins interlaced 603 or not, copper foam 604, etc.).

Preferably a honeycomb heatsink 602 has been selected (Rth_total=1.3° C./W (10 GaN); L2.79×W0.83×H0.26 in.) because it minimizes GaN temperature and has holes large enough to avoid any clogging by dust. The two-dimensional structure surfacically distributes the temperature and further reduces the number of hot spots.

Several inductors 504 (but not all) are preferably thermally fastened to the copper shield 503. In order to meet the external enclosure 60° C. temperature limit requirement, a Gap-Pad 502 provides an electrically insulating but thermally conductive interface between the shield 503 and the external copper enclosure 501. Thereby the thermal resistance of the interface helps to extract heat from the hottest inner components and prevent this heat to be dissipated locally by the external enclosure.

Electromagnetic Compliance (EMC)

In order to be compliant with FCC part 15 class B (for residential equipment, which is more restrictive than FCC Class A, for commercial or industrial equipment), the choice of the topology design and of the modulation type has been based on noise source models. Each filter has been simulated with an established noise model to optimize the inductor design and the PCB routing. Key factors according to the present invention to meet for class B can be summarized as follows:
- soft switching operation of the main switches and auxiliary supply independently of the load;
- variable frequency and specific spread spectrum modulation;
- a first internal shield electrically connected to (L-=0 V DC);
- a second shield (external enclosure) and a last filter stage shielding;
- an $AC_{out}$ filter referenced to (L-);
- the use of several small filters instead of a large one;
- the suppression of all the resonant poles at frequencies higher than 50 kHz;
- the use of ceramic capacitors to minimize the parasitic inductances and their size;
- the minimization of coupling between filters;
- the minimization of capacitive coupling in the inductor design.

LIST OF REFERENCE SYMBOLS

100 Common mode noise filter
101 Differential mode noise filter
201 Line switch half bridge
202 Neutral switch half bridge
203 Active filter half bridge
204 Earth shielding or connection
301 Capacitive divider for zero-current crossing detection
302 CMN filter for GaN switch gate
303 GaN driver
310 upper switch of half bridge
311 lower switch of half bridge
501 Copper enclosure
502 Insulation/thermal interface
503 Copper shielding
504 Inductor(s)
505 Ceramic inductor gap
506 PCB interconnection
507 Micro-spring contacts
508 Silicone foam
509 GaN switch 510 PCB with thermal vias
511 Ceramic insulation
512 Honeycomb heatsink
513 PCB for mounting storage capacitors
514 Active filter ceramic capacitor
601 Multiple blades heatsink
602 Honeycomb heatsink
603 Interlaced fins heatsink
604 Copper foam heatsink

The invention claimed is:

1. A single phase, non-insulated, miniaturized DC/AC power inverter (1) having an output power density higher than 3000 W/dm$^3$, comprising:
   a DC input having a positive terminal (L+) and a negative terminal (L−);
   an AC output having a line terminal (L) and a neutral terminal (N);
   at least a H full bridge switch topology made of a first half-bridge (201) having a first switch (S1_H) in series with a second switch (S1_L), and of a second half-bridge (202) having a third switch (S2_H) in series with a fourth switch (S2_L), said first switch (S1_H) being connected at one end to the positive terminal (L+) of the DC input, said second switch (S1_L) being connected at one end to the negative terminal (L−) of the DC input, the other end of the first switch (S1_H) being connected to the other end of the second switch (S1_L), defining a first common end, said first common end being connected to the line terminal (L) of the AC output, said third switch (S2_H) being connected at one end to the positive terminal (L+) of the DC input, said fourth switch (S2_L) being connected at one end to the negative terminal (L−) of the DC input, the other end of the third switch (S2_H) being connected to the other end of the fourth switch (S2_L), defining a second common end, said second common end being connected to the neutral terminal (N) of the AC output,
   at least one common mode noise EMI filter (100) connected between the first and the second common ends of the half-bridges and the terminals of the AC output,
   at least one differential mode noise EMI filter (101) connected between the first and the second common ends of the half-bridges and the terminals of the AC output;
   said common mode noise filter (100) having at least two "Y"-capacitors and two coupled inductors and said differential mode noise filter (101) having at least one "X"-capacitor;
   wherein said first (S1_H), second (S1_L), third (S2_H) and fourth (S2_L) switches are made of wide-band semiconductors;
   wherein said DC/AC power inverter (1) further comprises:
   a ripple-compensating active filter comprising a third half-bridge (203) having a fifth switch (S3_H) in series with a sixth switch (S3_L), said fifth switch (S3_H) being connected at one end to the positive terminal (L+) of the DC input, said sixth switch (S3_L) being connected at one end to the negative terminal (L−) of the DC input, the other end of the fifth switch (S3_H) being connected to the other end of the sixth switch (S3_L), defining a third common end, said third common end being connected to a first end of a LC filter, made of at least one inductor (L6) and one storage capacitor (C5), a second end of the LC filter being connected to the negative terminal (L−);
   modulation control means of said first (S1_H), second (S1_L), third (S2_H), fourth (S2_L), fifth (S3_H) and sixth (S3_L) switches for providing a switch frequency comprised between 20 and 500 kHz and allowing variable phase shifts between any two of said first (201), second (202) and third (203) half-bridges and allowing dead time modulation of the switches of said half-bridges (201, 202, 203),
   so that to obtain a switching approaching ZVS switching, in particular to obtain switching when current crosses through zero and further to cancel switching losses and so that to allow high peak-to-peak voltage variations in the active filter, while storing corresponding energy in the storage capacitors (C5),
   wherein the Y-capacitors of said common mode noise filter (100) are referenced to a shielding being at a reference potential, said shielding being insulated from earth, said Y-capacitors having a value comprised between 100 nF and several µF.

2. The DC/AC power inverter (1) of claim 1, wherein the coupled inductors of the common mode noise filter (100) have an external volume of about 5000 mm$^3$, in the case of a 2 kW inverter, compatible with a reduced magnetic flux variation in said coupled inductors, obtained thanks to a dynamic change of the PWM phase between the two legs of the full bridge.

3. The DC/AC power inverter (1) of claim 1, further comprising an input tank capacitor (C1) less than 15 µF, the active filter capacitor (C5) being less than 150 µF.

4. The DC/AC power inverter (1) of claim 1, further comprising sensorless state observers for estimating the currents in the inverter, except the output current.

5. The DC/AC power inverter (1) of claim 1, further comprising for each switch, a circuit having a capacitive divider (301) for detecting the switch current zero crossover through the gate connection of the respective switches, so as to adjust a switch dead-time which is sufficiently long to prevent a risk of cross conduction between the switches of a half-bridge, while minimizing power losses due to reverse currents.

6. The DC/AC power inverter (1) of claim 5, wherein the circuit further comprises a common mode noise filter (302) relative to earth for protecting the drivers (303) of the switches, the inductors L31, L32 of the common mode filter (302) and the capacitors of the capacitive divider (301) being part of a RLC filter R'-L31-L32-C33-C34 acting as a low-pass filter whose components are selected so as to reduce the dv/dt on each switch to a value less than 50 V/ns.

7. The DC/AC power inverter (1) of claim 1, further comprising an open loop Hall sensor combined with an electromagnetic shield for measuring the inverter output current.

8. The DC/AC power inverter (1) of claim 1, wherein the capacitors are multilayer ceramic capacitors.

9. The DC/AC power inverter (1) of claim 1, wherein an auxiliary power supply is provided under the form of a soft switching LLC resonant circuit.

10. The DC/AC power inverter (1) of claim 1, further comprising control means for maintaining DC input voltage essentially constant, while allowing ripple variation across the active filter.

11. The DC/AC power inverter (1) of claim 10, wherein the control means comprise a learning algorithm for reducing the DC input ripple through correction of modeling errors due to the presence of switch dead times.

12. The DC/AC power inverter (1) of claim 1, wherein the first half-bridge (201) and the second half-bridge (202) are each split by an additional half-bridge mounted thereon in parallel.

13. The DC/AC power inverter (1) of claim 1, wherein said wide-band semiconductors are gallium nitride or GaN semiconductors.

14. The DC/AC power inverter (1) of claim 6, wherein the low-pass filter whose components are selected so as to reduce the dv/dt on each switch are to said value being less than 25 V/ns.

* * * * *